(12) United States Patent
Hsu et al.

(10) Patent No.: US 8,907,395 B2
(45) Date of Patent: Dec. 9, 2014

(54) SEMICONDUCTOR STRUCTURE

(75) Inventors: Chen-Chiu Hsu, Hsinchu (TW); Tung-Ming Lai, Hsinchu (TW); Kai-An Hsueh, Miaoli County (TW); Ming-De Huang, New Taipei (TW)

(73) Assignee: Maxchip Electronics Corp., Hsinchu (TW)

( * ) Notice: Subject to any disclaimer, the term of this patent is extended or adjusted under 35 U.S.C. 154(b) by 259 days.

(21) Appl. No.: 13/244,640

(22) Filed: Sep. 25, 2011

(65) Prior Publication Data

US 2013/0043522 A1 Feb. 21, 2013

(30) Foreign Application Priority Data

Aug. 16, 2011 (TW) .............................. 100129230 A

(51) Int. Cl.
*H01L 29/78* (2006.01)
*H01L 27/115* (2006.01)
*H01L 49/02* (2006.01)

(52) U.S. Cl.
CPC .......... *H01L 27/11526* (2013.01); *H01L 28/20* (2013.01)
USPC .................. 257/311; 257/350; 257/E21.419; 257/E21.703

(58) Field of Classification Search
USPC .................... 257/E21.639, E21.644, E27.016
See application file for complete search history.

(56) References Cited

U.S. PATENT DOCUMENTS

| 4,367,580 | A | 1/1983 | Guterman |
| 5,789,293 | A | 8/1998 | Cho et al. |
| 5,879,990 | A | 3/1999 | Dormans et al. |
| 6,174,759 | B1 | 1/2001 | Verhaar et al. |
| 6,284,599 | B1 | 9/2001 | Mehrad et al. |
| 6,603,172 | B1 | 8/2003 | Segawa et al. |
| 7,888,740 | B2 * | 2/2011 | Tsutsumi et al. ............. 257/358 |
| 8,426,267 | B2 * | 4/2013 | Tsutsumi et al. ............. 438/238 |
| 2005/0167786 | A1 * | 8/2005 | Gill et al. ....................... 257/573 |
| 2008/0067599 | A1 * | 3/2008 | Tsutsumi et al. ............. 257/358 |
| 2008/0203465 | A1 | 8/2008 | Yamada |
| 2012/0086068 | A1 * | 4/2012 | Horch ........................... 257/324 |

OTHER PUBLICATIONS

"Office Action of Taiwan Counterpart Application", issued on Sep. 26, 2014, p. 1-p. 9.

* cited by examiner

*Primary Examiner* — Kevin M. Picardat
*Assistant Examiner* — Tsz Chiu
(74) *Attorney, Agent, or Firm* — Jianq Chyun IP Office

(57) ABSTRACT

A method of forming a semiconductor structure is provided. A substrate having a cell area and a periphery area is provided. A stacked structure including a gate oxide layer, a floating gate and a first spacer is formed on the substrate in the cell area and a resistor is formed on the substrate in the periphery area. At least two doped regions are formed in the substrate beside the stacked structure. A dielectric material layer and a conductive material layer are sequentially formed on the substrate. A patterned photoresist layer is formed on the substrate to cover the stacked structure and a portion of the resistor. The dielectric material layer and the conductive material layer not covered by the patterned photoresist layer are removed, so as to form an inter-gate dielectric layer and a control gate on the stacked structure, and simultaneously form a salicide block layer on the resistor.

9 Claims, 3 Drawing Sheets

SEMICONDUCTOR STRUCTURE

CROSS-REFERENCE TO RELATED APPLICATION

This application claims the priority benefit of Taiwan application serial no. 100129230, filed on Aug. 16, 2011. The entirety of the above-mentioned patent application is hereby incorporated by reference herein and made a part of this specification.

BACKGROUND OF THE INVENTION

1. Field of Invention

The present invention relates to a semiconductor structure and a method of forming the same, and more generally to a semiconductor structure including a memory unit and a resistor and a method of forming the same.

2. Description of Related Art

A non-volatile memory device provides the advantages of multiple entries, retrievals and erasures of data, and is able to retain the stored information even when the electrical power is off. As a result, a non-volatile memory device is widely used in personal computers and consumer electronic products.

An erasable programmable read-only memory with tunnel oxide (EPROM with tunnel oxide; ETOX) is a common memory cell structure, in which a floating gate and a control gate for performing erasing/writing operations are formed by doped polysilicon. During the ETOX operation, in order to prevent the problem of data error due to over-erasing/writing phenomenon, a select transistor is serially connected at one side of the memory cell to form a two-transistor (2T) structure. When multiple time programming (MTP) is performed, the programming and reading operations of the memory cell can be controlled by the select transistor.

As a multi-function chip is developed, a memory unit in a memory area and a voltage divider (e.g. resistor) in a periphery area are usually formed on the same chip. However, the process for fabricating the memory unit is commonly separated from the process for fabricating the resistor. Therefore, multiple photomasks and complicated process steps are required, so as to increase the process cost and reduce the competitiveness in the market.

SUMMARY OF THE INVENTION

Accordingly, the present invention provides a method of forming a semiconductor structure. The semiconductor structure including a memory unit and a resistor can be easily formed with the existing process, and the formed structure meet the customers' electrical requirements.

The present invention provides a method of forming a semiconductor structure. A substrate is provided. The substrate has a cell area and a periphery area. A stacked structure is formed on the substrate in the cell area and a resistor is formed on the substrate in the periphery area, wherein the stacked structure includes a gate oxide layer, a floating gate and a first spacer. At least two doped regions are formed in the substrate beside the stacked structure. A dielectric material layer and a conductive material layer are sequentially formed on the substrate. A patterned photoresist layer is formed on the conductive material layer. The dielectric material layer and the conductive material layer which are not covered by the patterned photoresist layer are removed, so as to form an inter-gate dielectric layer and a control gate on the stacked structure and simultaneously form a salicide block (SAB) layer on the resistor, wherein the gate oxide layer, the floating gate, the inter-gate dielectric layer and the control gate forms a charge storage structure.

According to an embodiment of the present invention, after the step of forming the charge storage structure, the method further includes forming a second spacer on a sidewall of the charge storage structure and on a sidewall of the SAB layer; and forming a salicide layer on a surface of the control gate of the charge storage structure, on surfaces of doped regions, and on a surface of the resistor not covered by the SAB layer.

According to an embodiment of the present invention, the material of the salicide layer includes cobalt silicide.

According to an embodiment of the present invention, a select transistor is simultaneously formed at a side of the stacked structure on the substrate in the cell area during the step of forming the stacked structure and the resistor, wherein the doped regions are further formed in the substrate beside the select transistor, the charge storage structure and the select transistor share one doped region.

According to an embodiment of the present invention, the material of the conductive material layer includes doped polysilicon.

The present invention further provides a semiconductor structure including a substrate, a charge storage structure, a resistor, a dielectric layer and a second conductive layer. The substrate has a cell area and a periphery area. The charge storage structure is disposed on the substrate in the cell area, wherein the charge storage structure includes a gate oxide layer, a floating gate, an inter-gate dielectric layer and a control gate sequentially disposed on the substrate. The resistor is disposed on the substrate in the periphery area, wherein the resistor includes an oxide layer and a first conductive layer sequentially disposed on the substrate. The dielectric layer and the second conductive layer are sequentially disposed on the resistor, wherein the dielectric layer and the second conductive layer constitute a salicide block (SAB) layer.

According to an embodiment of the present invention, the semiconductor structure further includes a shallow trench isolation structure, a first spacer, a second spacer, a third spacer and at least two doped regions. The shallow trench isolation structure is disposed in the substrate below the resistor. The first spacer is disposed on a sidewall of the charge storage structure. The second spacer is disposed on a sidewall of the resistor. The third spacer is disposed on a sidewall of the SAB layer. The doped regions are disposed in the substrate beside the charge storage structure.

According to an embodiment of the present invention, the semiconductor structure further includes a salicide layer disposed on a surface of the control gate of the charge storage structure, on surfaces of the doped regions, on a surface of the second conductive layer of the SAB layer, and on a surface of the first conductive layer of the resistor not covered by the second conductive layer and the third spacer.

According to an embodiment of the present invention, the material of the salicide layer includes cobalt silicide.

According to an embodiment of the present invention, the semiconductor structure further includes a select transistor disposed on the substrate in the cell area and located at a side of the charge storage structure.

According to an embodiment of the present invention, the select transistor includes a select gate oxide layer and a select gate sequentially disposed on the substrate.

According to an embodiment of the present invention, the semiconductor structure further includes a shallow trench isolation structure, a first spacer, a second spacer, a third spacer, a fourth spacer and a plurality of doped regions. The shallow trench isolation structure is disposed in the substrate below the resistor. The first spacer is disposed on a sidewall of the charge storage structure. The second spacer is disposed on a sidewall of the resistor. The third spacer is disposed on a sidewall of the SAB layer. The fourth spacer is disposed on a sidewall of the select transistor. The doped regions are disposed in the substrate beside the charge storage structure and beside the select transistor, wherein the charge storage structure and the select transistor share one doped region.

According to an embodiment of the present invention, the semiconductor structure further includes a salicide layer disposed on a surface of the control gate of the charge storage structure, on a surface of the select transistor, on surfaces of the doped regions, on a surface of the second conductive layer of the SAB layer, and on a surface of the first conductive layer of the resistor not covered by the second conductive layer and the third spacer.

According to an embodiment of the present invention, the material of the salicide layer includes cobalt silicide.

According to an embodiment of the present invention, the material of the first conductive layer and the second conductive layer includes doped polysilicon.

In view of the above, the manufacturing method of the present invention can be easily integrated with the existing process (e.g. logic process). The semiconductor structure including a memory unit and a resistor can be easily formed with the existing process, so that the process cost is greatly reduced, and the competitive advantage is achieved. The said memory unit can be an ETOX structure or a two-transistor (2T) structure including a charge storage structure and a select gate, and is capable of one-time programming (OTP) or multiple-time programming (MTP) operation according to the customers' requirements.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
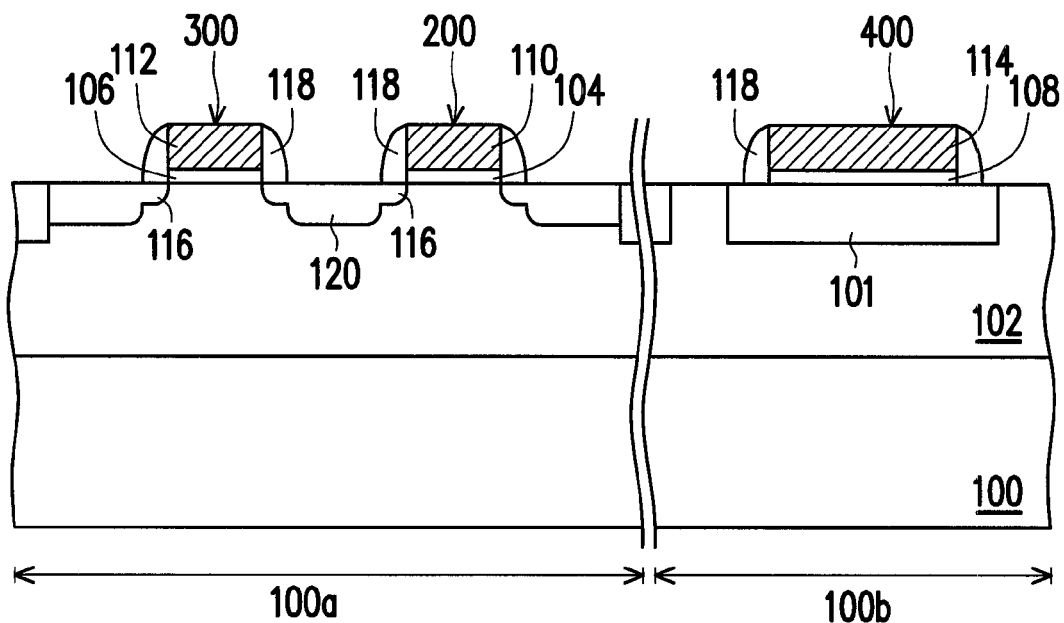
FIGS. 1A to 1D schematically illustrate cross-sectional views of a method of forming a semiconductor structure according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

FIGS. 1A to 1D schematically illustrate cross-sectional views of a method of forming a semiconductor structure according to a first embodiment of the present invention.

Referring to FIG. 1A, a substrate 100 is provided. The substrate 100 is a P-type silicon substrate, for example. The substrate 100 has a cell area 100a and a periphery area 100b.

A well region 102 is formed in the substrate 100. The well region 102 is a P-type well region, for example. In an embodiment, a deep well region (not shown) can be optionally formed in the substrate 100 below the well region 102. Further, a plurality of shallow trench isolation (STI) structures 101 is formed in the substrate 100, and at least one STI structures 101 is located in the substrate 100 in the periphery area 100b.

Thereafter, an oxide material layer and a conductive material layer (not shown) are sequentially formed on the substrate 100. The material of the oxide material layer is silicon oxide, for example. The method of forming the oxide material layer includes performing a thermal oxidation process or a chemical vapour deposition (CVD) process. The material of the conductive material layer is doped polysilicon, for example. The method of forming the conductive material layer includes performing a CVD process. Afterwards, the oxide material layer and the conductive material layer are patterned, so as to form a stacked structure 200 and a select transistor 300 on the substrate 100 in the cell area 100a and form a resistor 400 on the substrate 100 in the periphery area 100b. The stacked structure 200 includes a gate oxide layer 104 and a floating gate 110 sequentially disposed on the substrate 100. The select transistor 300 includes a select gate oxide layer 106 and a select gate 112 sequentially disposed on the substrate 100. The resistor 400 includes an oxide layer 108 and a conductive layer 114 sequentially disposed on the substrate 100. It is noted that the gate oxide layer 104, the select gate oxide layer 106 and the oxide layer 108 are made of the same material and thickness, the floating gate 110, the select gate 112 and the conductive layer 114 are made of the same material and thickness, and the said layers can be formed in the same patterning step.

Lightly doped regions 116 are then formed in the substrate 100 beside the stacked structure 200 and beside the select transistor 300. The lightly doped regions 116 are N-type lightly doped regions, for example. Thereafter, a spacer 118 is formed on the sidewall of the stacked structure 200, on the sidewall of the select transistor 300 and on the sidewall of the transistor 400. The material of the spacer 118 is silicon oxide, silicon nitride or silicon oxynitride, for example. The method of forming the spacer 118 includes performing a CVD process and followed by an anisotropic etching process. Afterwards, a plurality of doped regions 120 is formed in the substrate 100 beside the stacked structure 200 and beside the select transistor 300. The doped regions 120 are N-type doped regions, for example. In addition, the stacked structure 200 (or the subsequently formed charge storage structure 200') and the select transistor 300 share one doped region 120.

Figure 1B:
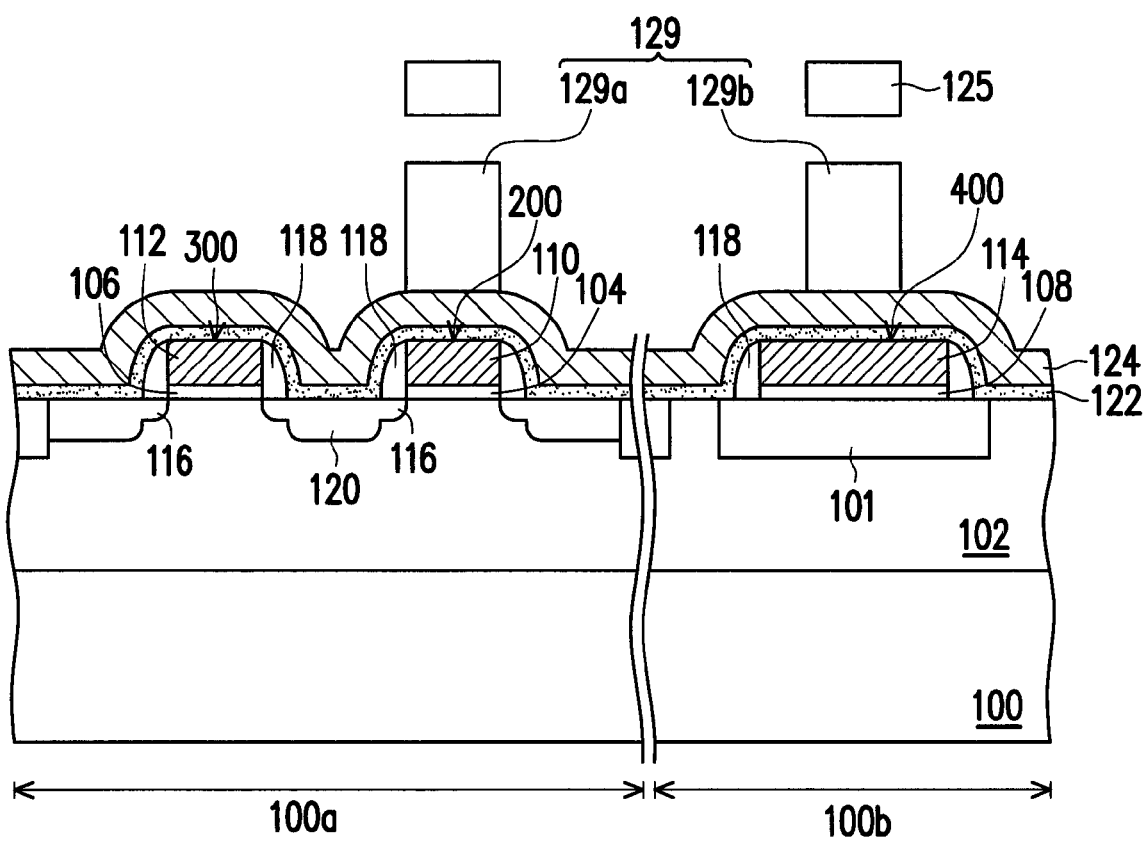

Referring to FIG. 1B, a dielectric material layer 122 and a conductive material layer 124 are sequentially formed on the substrate 100 to cover the stacked structure 200, the select gate 300 and the resistor 400. The dielectric material layer 122 can be a single silicon oxide layer or a silicon oxide-silicon nitride-silicon oxide (ONO) composite layer. In FIG. 1B, the dielectric material layer 122 is, for example, a single-layer structure, but the present invention is not limited thereto. The material of the conductive material layer 124 is doped polysilicon, for example. The method of forming the conductive material layer 124 includes performing a CVD process.

Thereafter, a patterned photoresist layer 129 is formed on the substrate 100 to at least cover the stacked structure 200. In this embodiment, the photomask 125 is used to form the patterned photoresist layer 129. Moreover, the patterned photoresist layer 129 covers the stacked structure 200 and a portion of the resistor 400 but does not cover the select gate 300.

Figure 1C:
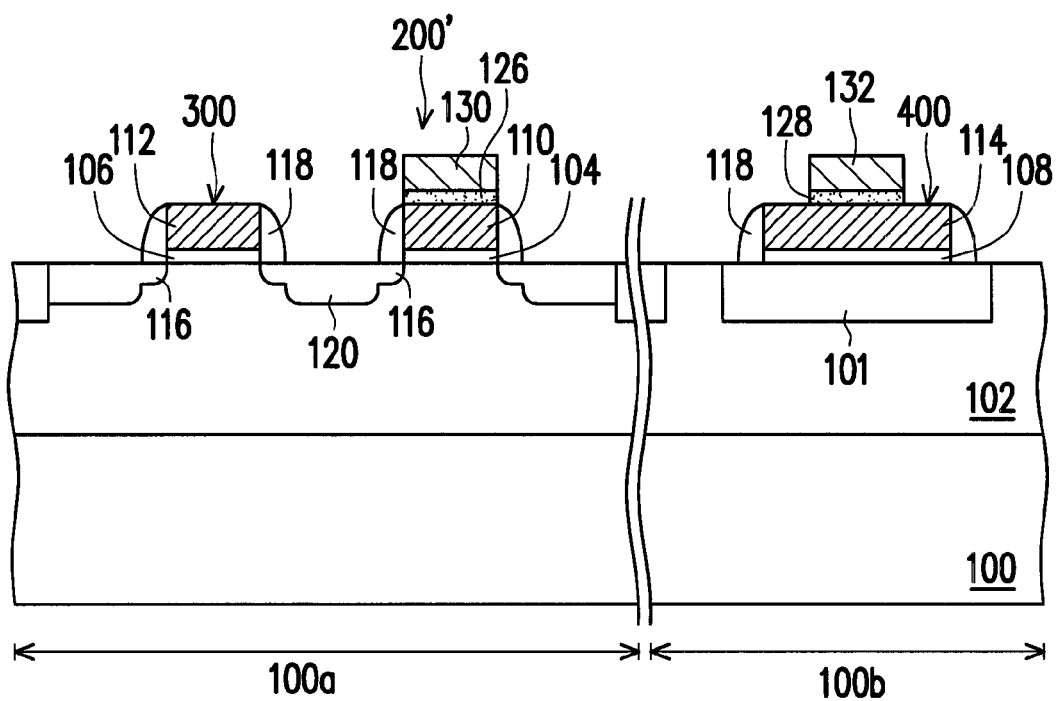

Referring to FIG. 1C, the dielectric material layer 122 and the conductive material layer 124 not coved by the patterned photoresist layer 129 are removed, so as to form a charge storage structure 200' on the substrate 100 in the cell area 100a and form a dielectric layer 128 and a conductive layer 132 on the resistor 400. The charge storage structure 200' includes the gate oxide layer 104, the floating gate 110, an inter-gate dielectric layer 126 and a control gate 130. It is noted that the inter-gate dielectric layer 126 and the dielectric layer 128 are made of the same material and thickness, the control gate 130 and the conductive layer 132 are made of the same material and thickness, and the said layers can be formed in the same patterning step.

It is also noted that the dielectric material layer 122 and the conductive material layer 124 of the present invention replace the conventional salicide block (SAB) material layer, and the pattern for defining the control gate 130 is embedded into the photomask for defining the SAB layer. Therefore, only one photomask 125 is used to achieve the purpose of reducing the process cost. Specifically, the pattern 129a of the patterned photoresist layer 129 is for defining the control gate 130, and the pattern 129b of the same is for defining the SAB layer, as shown in FIG. 1B. Although the dielectric layer 128 and the conductive layer 132 remain on the resistor 400 in the periphery area 100b, the resistance of the resistor 400 originally requested by the customers are not changed by these two layers, and the electric property thereof is not affected, while the control gate 130 and the SAB layer can be simultaneously defined by using only one photomask 125.

Figure 1D:
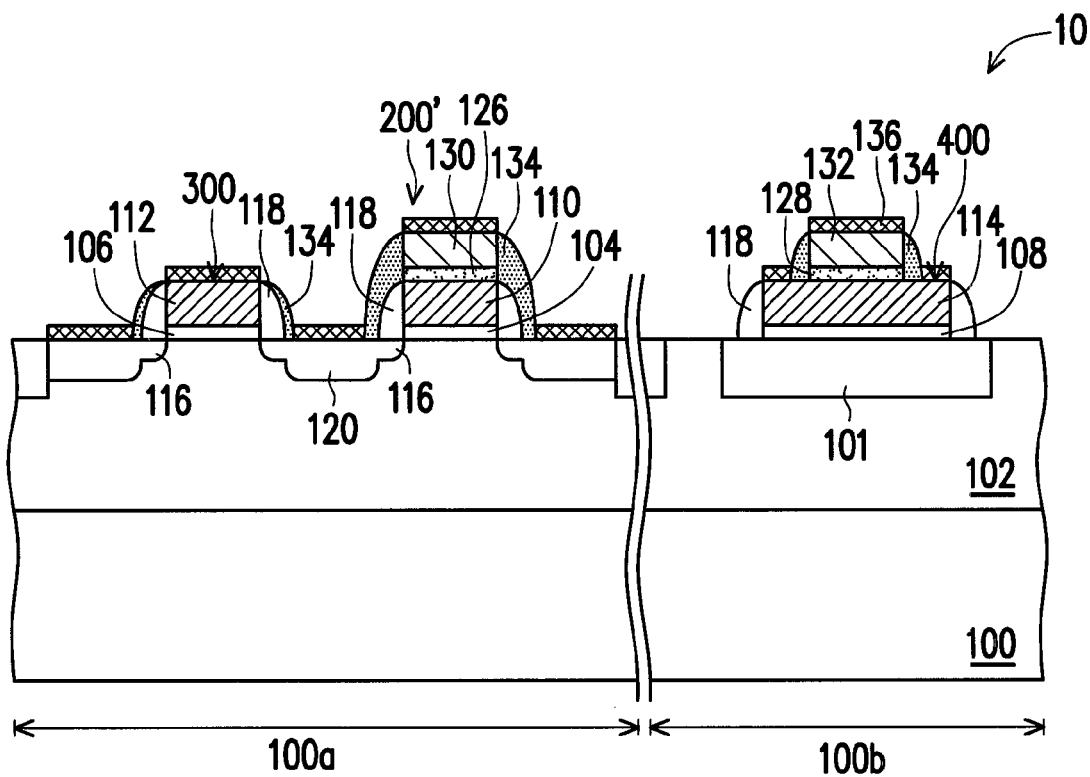

Referring to FIG. 1D, a spacer 134 is formed on the sidewall of the charge storage structure 200', on the sidewall of the select gate 300 and on the sidewalls of the dielectric layer 128 and the conductive layer 132. The material of the spacer 134 is silicon oxide, silicon nitride or silicon oxynitride, for example. The method of forming the spacer 134 includes performing a CVD process and followed by an anisotropic etching process.

Thereafter, a metal layer (not shown) is formed on the substrate 100. The material of the metal layer is cobalt, for example. The method of forming the metal layer includes performing a CVD process. Afterwards, an annealing treatment is performed, so that a portion of the metal layer is reacted with silicon to form a salicide layer 136. The salicide layer 136 is formed on the surface of the select gate 300, on the surface of the charge storage structure 200', on the surfaces of the doped regions 120, on the surface of the conductive layer 132 and on a portion of the surface of the resistor 400. The material of the salicide layer 136 is cobalt silicide, for example. Next, the unreacted metal layer is removed. The semiconductor structure 10 of the present invention is thus completed.

Referring to FIG. 1D, the semiconductor structure 10 includes a substrate 100, a charge storage structure 200', a select transistor 300, a resistor 400, a dielectric layer 128 and a conductive layer 132. The substrate 100 has a cell area 100a and a periphery area 100b. The charge storage structure 200' and the select transistor 300 are disposed on the substrate 100 in the cell area 100a. The charge storage structure 200' includes a gate oxide layer 104, a floating gate 110, an inter-gate dielectric layer 126 and a control gate 130 sequentially disposed on the substrate 100. The select transistor 300 includes a select gate oxide layer 106 and a select gate 112 sequentially disposed on the substrate 100. The resistor 400 is disposed on the substrate 100 in the periphery area 100b. The resistor 400 includes an oxide layer 108 and a conductive layer 114 sequentially disposed on the substrate 100. The dielectric layer 128 and the conductive layer 132 are sequentially disposed on the resistor 400, wherein the area of the dielectric layer 128 or the conductive layer 132 is smaller than that of the conductive layer 114.

In addition, a STI structure 101 is disposed in the substrate 100 below the resistor 400. A spacer 118 and a spacer 134 are disposed on the sidewall of the charge storage structure 200'. The spacer 118 is disposed on the sidewall of the resistor 400. The spacer 134 is disposed on the sidewalls of the dielectric layer 128 and the conductive layer 132, wherein the dielectric layer 128 and the conductive layer 132 constitute a SAB layer. The spacer 118 and the spacer 134 are disposed on the sidewall of the select transistor 300. Doped regions 120 are disposed in the substrate 100 beside the charge storage structure 200' and beside the select transistor 300, and the charge storage structure 200' and the select transistor 300 share one doped region 120. A salicide layer 136 is disposed on the surface of the charge storage structure 200', on the surface of the select transistor 300, on the surfaces of the doped regions 120, on the surface of the conductive layer 132 and on the surface of the conductive layer 114 not covered by the conductive layer 132. The material of the salicide layer 136 includes cobalt silicide. The material of the conductive layer 114 and the conductive layer 132 includes doped polysilicon.

Second Embodiment

Figure 2:
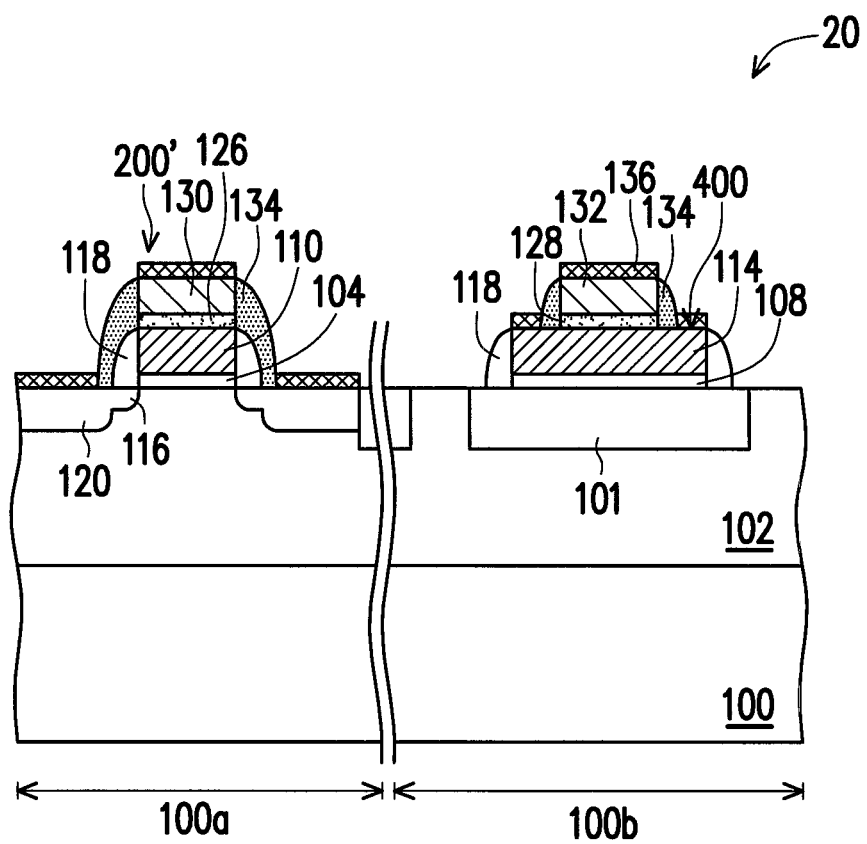
FIG. 2 schematically illustrates a cross-sectional view of a semiconductor structure according to a second embodiment of the present invention.

The above-mentioned embodiment in which the two-transistor (2T) structure including the charge storage structure 200' and the select transistor 300 in the cell area 100a is provided for illustration purposes, and is not construed as limiting the present invention. In another embodiment, only the charge storage structure 200' is formed in the cell area 100a so as to form the semiconductor structure 20 as shown in FIG. 2.

In summary, the existing logic process can be used to form the semiconductor structure including a memory unit and a resistor by embedding the pattern for defining the control gate into the SAB photomask. In the present invention, the formed semiconductor structure including the memory unit and the resistor meets the customers' electric requirements. The said memory unit can be an ETOX structure or a 2T structure including a charge storage structure and a select transistor, and is capable of one-time programming (OTP) or multiple-time programming (MTP) operation according to the customers' requirements. Further, as compared with the conventional complicated process, the method of the present invention can simultaneously fabricate the memory unit and the resistor with the existing process. Therefore, the process cost is significantly reduced, and the competitive advantage is achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor structure, comprising:
   a substrate, having a cell area and a periphery area;
   a charge storage structure, disposed on the substrate in the cell area, wherein the charge storage structure comprises a gate oxide layer, a floating gate, an inter-gate dielectric layer and a control gate sequentially disposed on the substrate;
   a resistor, disposed on the substrate in the periphery area, wherein the resistor comprises an oxide layer and a first conductive layer sequentially disposed on the substrate;

a dielectric layer and a second conductive layer, sequentially disposed on the resistor, wherein the dielectric layer and the second conductive layer constitutes a salicide block (SAB) layer, and wherein the second conductive layer and the control gate are made of the same material;

a shallow trench isolation structure, disposed in the substrate below the resistor;

a first spacer, disposed on a sidewall of the charge storage structure;

a second spacer, disposed on a sidewall of the resistor;

a third spacer, disposed on a sidewall of the SAB layer; and at least two doped regions, disposed in the substrate beside the charge storage structure.

2. The semiconductor structure of claim 1, further comprising a salicide layer disposed on a surface of the control gate of the charge storage structure, on surfaces of the doped regions, on a surface of the second conductive layer of the SAB layer, and on a surface of the first conductive layer of the resistor not covered by the second conductive layer and the third spacer.

3. The semiconductor structure of claim 2, wherein a material of the salicide layer comprises cobalt silicide.

4. The semiconductor structure of claim 1, further comprising a select transistor disposed on the substrate in the cell area and located at a side of the charge storage structure.

5. The semiconductor structure of claim 4, wherein the select transistor comprises a select gate oxide layer and a select gate sequentially disposed on the substrate.

6. The semiconductor structure of claim 4, further comprising:

a fourth spacer, disposed on a sidewall of the select transistor, wherein the at least two doped regions are further disposed beside the select transistor, and the charge storage structure and the select transistor share one doped region.

7. The semiconductor structure of claim 6, further comprising a salicide layer disposed on a surface of the control gate of the charge storage structure, on a surface of the select transistor, on surfaces of the doped regions, on a surface of the second conductive layer of the SAB layer, and on a surface of the first conductive layer of the resistor not covered by the second conductive layer and the third spacer.

8. The semiconductor structure of claim 7, wherein a material of the salicide layer comprises cobalt silicide.

9. The semiconductor structure of claim 1, wherein a material of the first conductive layer and the second conductive layer comprises doped polysilicon.

* * * * *